United States Patent
Chuang et al.

(10) Patent No.: US 6,660,592 B2
(45) Date of Patent: Dec. 9, 2003

(54) FABRICATING A DMOS TRANSISTOR

(75) Inventors: Chiao-Shun Chuang, Hsinchu (TW);
Chien-Ping Chang, Hsinchu (TW);
Mao-Song Tseng, Hsinchu (TW);
Cheng-Tsung Ni, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 21 days.

(21) Appl. No.: 10/160,299

(22) Filed: May 29, 2002

(65) Prior Publication Data

US 2003/0096485 A1 May 22, 2003

(30) Foreign Application Priority Data

Nov. 21, 2001 (TW) ........................................ 90128819 A

(51) Int. Cl.[7] ............................................. H01L 21/336
(52) U.S. Cl. ........................ 438/270; 438/259; 438/242; 438/307; 257/330
(58) Field of Search ................................. 438/270, 259, 438/242, 307; 257/330–338

(56) References Cited

U.S. PATENT DOCUMENTS

| | | | | |
|---|---|---|---|---|
| 4,853,345 A | * | 8/1989 | Himelick | 438/274 |
| 5,405,794 A | * | 4/1995 | Kim | 438/270 |
| 5,665,619 A | * | 9/1997 | Kwan et al. | 438/270 |
| 5,756,386 A | * | 5/1998 | Blanchard | 257/E29.259 |
| 5,930,630 A | * | 7/1999 | Hshieh et al. | 257/E29.259 |
| 6,015,737 A | * | 1/2000 | Tokura et al. | 257/E29.004 |
| 6,051,468 A | * | 4/2000 | Hshieh | 438/270 |
| 6,103,635 A | * | 8/2000 | Chau et al. | 438/424 |
| 6,204,135 B1 | * | 3/2001 | Peters et al. | 257/E29.104 |
| 6,211,549 B1 | * | 4/2001 | Funaki et al. | 257/329 |
| 6,242,288 B1 | * | 6/2001 | Francis et al. | 438/138 |
| 6,312,993 B1 | * | 11/2001 | Hshieh et al. | 257/327 |
| 6,351,009 B1 | * | 2/2002 | Kocon et al. | 257/328 |
| 6,368,920 B1 | * | 4/2002 | Beasom | 438/270 |
| 6,373,097 B1 | * | 4/2002 | Werner | 257/329 |
| 6,391,699 B1 | * | 5/2002 | Madson et al. | 438/212 |
| 6,404,025 B1 | * | 6/2002 | Hshieh et al. | 257/339 |
| 6,429,481 B1 | * | 8/2002 | Mo et al. | 257/331 |
| 2002/0175383 A1 | * | 11/2002 | Kocon et al. | 257/376 |

* cited by examiner

Primary Examiner—Phat X. Cao
Assistant Examiner—Thao X. Le
(74) Attorney, Agent, or Firm—Townsend and Townsend and Crew LLP

(57) ABSTRACT

Embodiment of the present invention are directed to improving the performance of a DMOS transistor. A method of fabricating a DMOS transistor comprises providing a semiconductor substrate having a gate oxide and a trenched gate, and implanting first conductive dopants into a surface of the semiconductor substrate adjacent to the trenched gate to form a first doping region. An insulating layer is deposited over the semiconductor substrate; and selectively etching the insulating layer to form a source contact window over a central portion of the first doping region and to leave an insulator structure above the trenched gate. The source contact window of the insulating layer has an enlarged top portion which is larger in size than a bottom portion of the source contact window closer to the first doping region than the enlarged top portion. The enlarged top portion is typically bowl-shaped. Second conductive dopants are implanted through the source contact window to form a second doping region in the central portion of the first doping region.

22 Claims, 7 Drawing Sheets

FABRICATING A DMOS TRANSISTOR

CROSS-REFERENCES TO RELATED APPLICATIONS

This application claims priority from R.O.C. patent application Ser. No. 090128819, filed Nov. 21, 2001, the entire disclosure of which is incorporated herein by reference.

BACKGROUND OF THE INVENTION

The present invention relates generally to the manufacture of semiconductor devices and, more particularly, to a method of forming a double diffusion metal-oxide-semiconductor (DMOS) transistor to reduce processing complexity and improve the performance of the semiconductor devices.

FIG. 1A to FIG. 1E are cross-sections showing the manufacturing process of a DMOS transistor according to the prior art.

As shown in FIG. 1A, a gate oxide 12 is formed in the trench for gate and on the surface of semiconductor substrate 10. Further, a trenched gate 14 made of polysilicon is then formed within the trench.

Then, as shown in FIG. 1B, ion implantation is performed to dope N-type impurities or dopants to form an N-type doping region 16 while a photoresist pattern 15 is used as the implanting mask. Referring to FIG. 1C, the photoresist pattern 15 is removed followed by the deposition of an insulating layer 18.

Next, as shown in FIG. 1D, a photoresist pattern 20 having an opening 22 is formed on the insulating layer 18. An anisotropic etching step creates a source contact window 22, thereby leaving an insulator structure 18a under the photoresist pattern 15. Further, ion implantation is performed to dope P-type impurities within the N-type doping region 16 so as to form a P-type doping region 24.

As shown in FIG. 1E, a thermal re-flowing step is used to treat the insulator structure 18a to form insulator structure 18b having a rounded surface. An aluminum layer (not shown) is sputtered on the insulating layer 18b to contact the source contact window 22.

However, the method of fabricating a DMOS transistor described above involves complex processing and high costs (such as photolithography and re-flowing). Moreover, the thermal re-flowing step as illustrated in FIG. 1E can cause undesirable change in the doping region thus altering the performance of the DMOS transistor. Furthermore, high thermal budget is required in the thermal re-flowing step.

BRIEF SUMMARY OF THE INVENTION

Embodiment of the present invention are directed to improving the performance of a DMOS transistor. One feature of the invention is to provide a method of fabricating a DMOS transistor to reduce processing complexity by eliminating at least one photolithography process. Another feature of the invention to provide a method of fabricating a DMOS transistor to reduce the thermal budget by using wet etching to replace thermal re-flowing.

In accordance with an aspect of the present invention, a method of fabricating a DMOS transistor comprises providing a semiconductor substrate having a gate oxide and a trenched gate; implanting first conductive dopants into a surface of the semiconductor substrate adjacent to the trenched gate to form a first doping region; depositing an insulating layer over the semiconductor substrate; and selectively etching the insulating layer to form a source contact window over a central portion of the first doping region and to leave an insulator structure above the trenched gate. The source contact window of the insulating layer has an enlarged top portion which is larger in size than a bottom portion of the source contact window closer to the first doping region than the enlarged top portion. Second conductive dopants are implanted through the source contact window to form a second doping region in the central portion of the first doping region.

In some embodiments, a wet etching is performed after implanting the second conductive dopants to reshape the insulator structure to form a rounded surface above the trenched gate. Selectively etching the insulating layer may comprise forming a photoresist pattern having an opening on the insulating layer above the first doping region, and dry etching the insulating layer through the opening to form the source contact window having the enlarged top portion over the central portion of the first doping region and to leave the insulator structure above the trenched gate. A conductive layer on the insulator structure may be formed, after implanting the second conductive dopants, to contact the source contact window. The conductive layer may be made of aluminum or an aluminum alloy. The first insulating layer may comprise BPSG or silicon oxide.

In some embodiments, the first conductive dopants are N-type dopants, and the second conductive dopants are P-type dopants. In other embodiments, the first conductive dopants are P-type dopants, and the second conductive dopants are N-type dopants. A junction depth of the first doping region is shallower than a junction depth of the second doping region. The method may further comprise removing a portion of the first doping region and the second doping region from the surface of the semiconductor substrate, wherein the first doping region has a concentration of the first conductive dopants which is larger than a maximum concentration of the second conductive dopants in the second doping region.

In accordance with another aspect of the present invention, a method of fabricating a DMOS transistor comprises providing a semiconductor substrate having a gate oxide and a trenched gate; implanting N-type dopants into a surface of the semiconductor substrate adjacent to the trenched gate to form an N-type doping region; depositing an insulating layer over the semiconductor substrate; forming a photoresist pattern having an opening above a central portion of the N-type doping region; wet etching the insulating layer through the opening of the photoresist pattern to form an undercut structure in the insulating layer below the opening of the photoresist pattern; and dry etching the insulating layer through the opening of the photoresist pattern to form a source contact window over the central portion of the N-type doping region and to leave an insulator structure under the photoresist pattern and above the trenched gate. The source contact window of the insulating layer has an enlarged top portion formed by the undercut structure. The method further comprises implanting P-type dopants through the source contact window to form a P-type doping region in the central portion of the N-type doping region; and removing the photoresist pattern.

In some embodiments, a wet etching is performed after removing the photoresist pattern to reshape the insulator structure to form a rounded surface above the trenched gate. A junction depth of the N-type doping region is shallower than a junction depth of the P-type doping region. Wet etching of the insulating layer is performed by buffered oxide etchant (BOE) or hydrogen fluoride (HF). Dry etching of the insulating layer is performed by reactive ion etching (RIE).

BRIEF DESCRIPTION OF THE DRAWINGS

FIG. 2G' is a cross-section showing a portion of the manufacturing process of a DMOS transistor according to another embodiment of the invention.

DETAILED DESCRIPTION OF THE INVENTION

Embodiment of the present invention are directed to improving the performance of a DMOS transistor by eliminating at least one photolithography process to reduce processing complexity and by using wet etching to replace thermal re-flowing to reduce the thermal budget. FIG. 2A to FIG. 2G are cross-sections showing the manufacturing process of a DMOS transistor according to one embodiment of the invention.

Figure 1A:
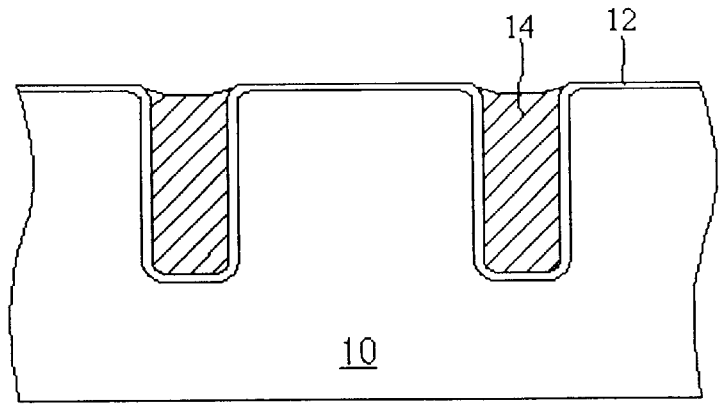
FIG. 1A to FIG. 1E are cross-sections showing the manufacturing process of a DMOS transistor, according to the prior art.
Figure 1B:
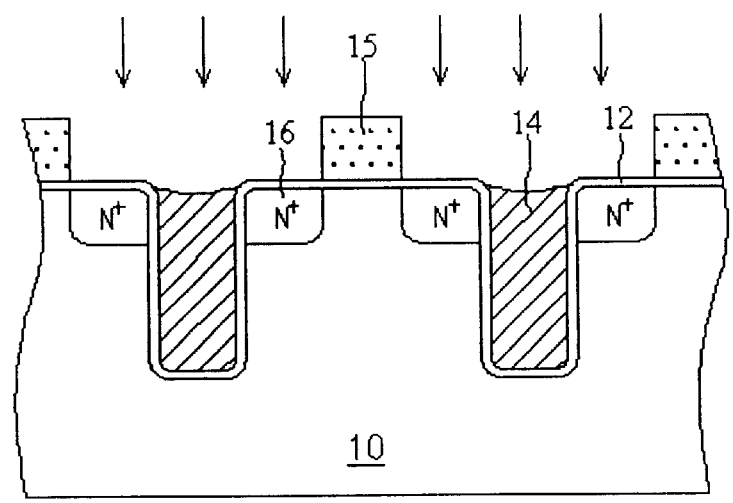
Figure 1C:
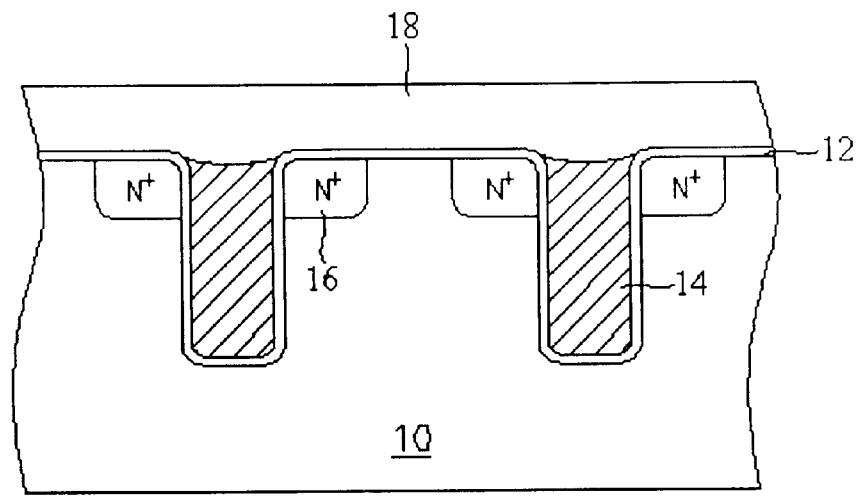
Figure 1D:
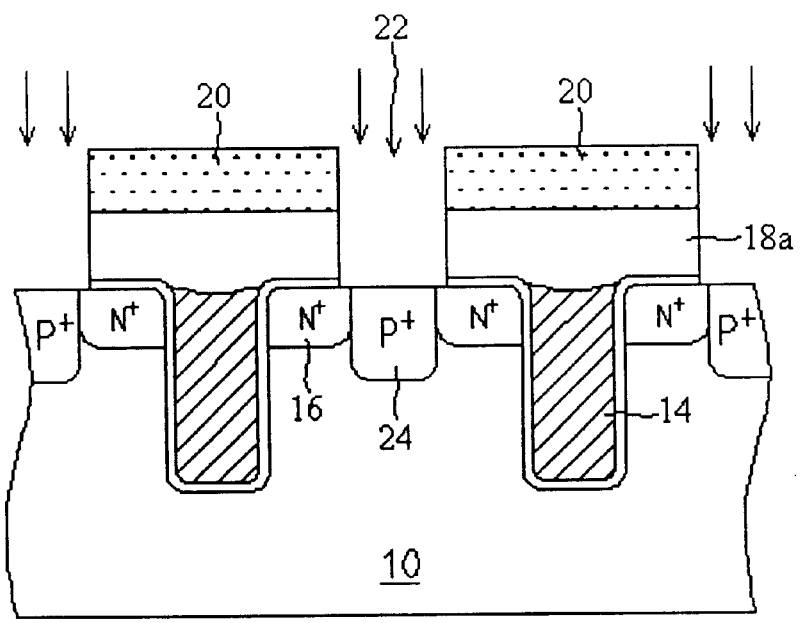
Figure 1E:
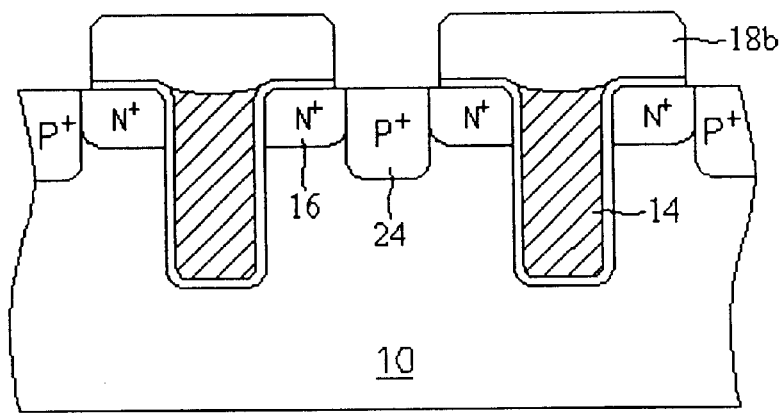
Figure 2A:
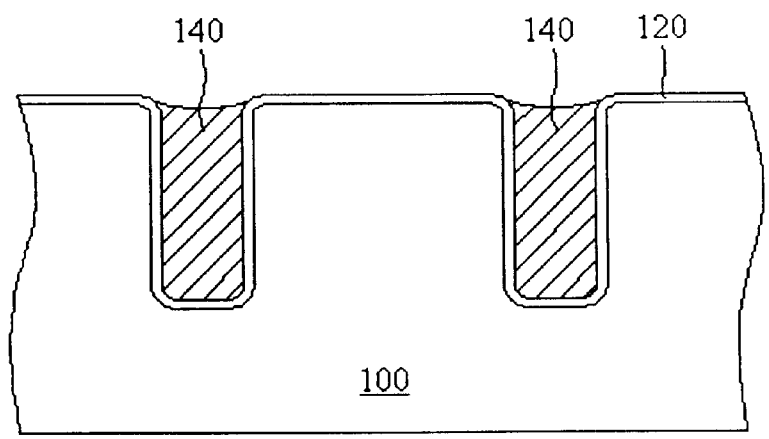
FIG. 2A to FIG. 2G are cross-sections showing the manufacturing process of a DMOS transistor according to one embodiment of the invention.
Figure 2B:
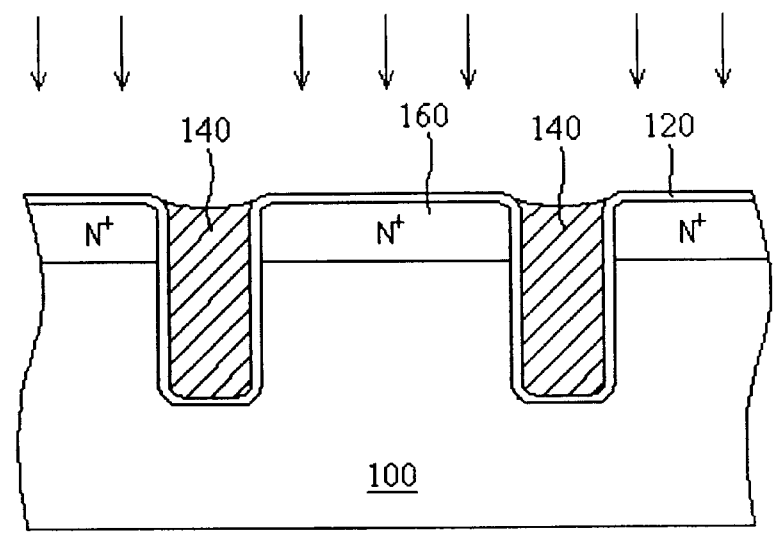

Referring to FIG. 2A, a gate oxide 120 is formed in the trench for gate and on the surface of semiconductor substrate 100. Further, a trenched gate 140 made of polysilicon is then formed within the trench. As shown in FIG. 2B, ion implantation is performed to dope N-type impurities or dopants such as phosphorus to form an N-type doping region 160 in the upper surface of the semiconductor substrate 100 adjacent to the trenched gate 140.

Figure 2C:
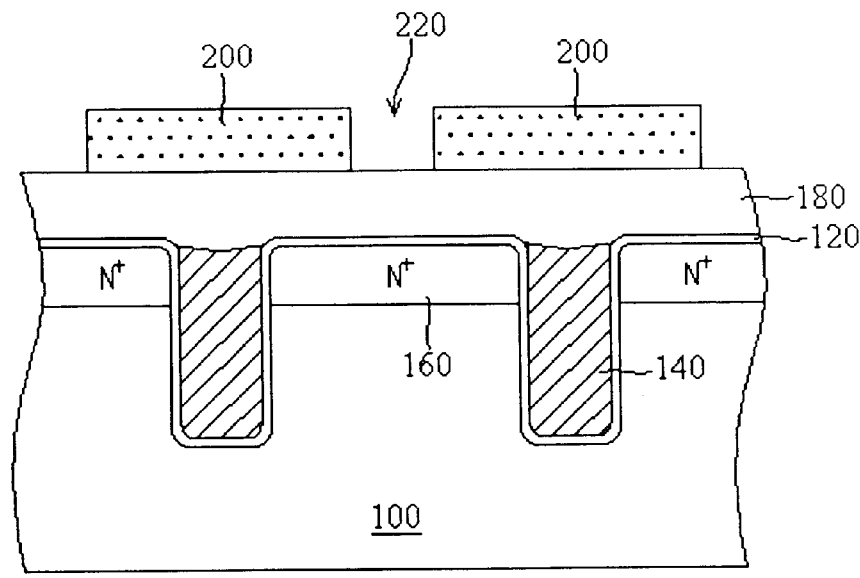

Afterward, as shown in FIG. 2C, an insulating layer 180, for example silicon oxide, borophosphosilicate glass (BPSG), or borosilicate glass (BSG), is deposited over the semiconductor substrate 100 by chemical vapor deposition (CVD). A conventional photolithography process comprising photoresist coating, photoresist exposing, and developing is then used to form a photoresist pattern 200 having an opening 220 aligning the central portion of the N-type doping region 160.

Figure 2D:
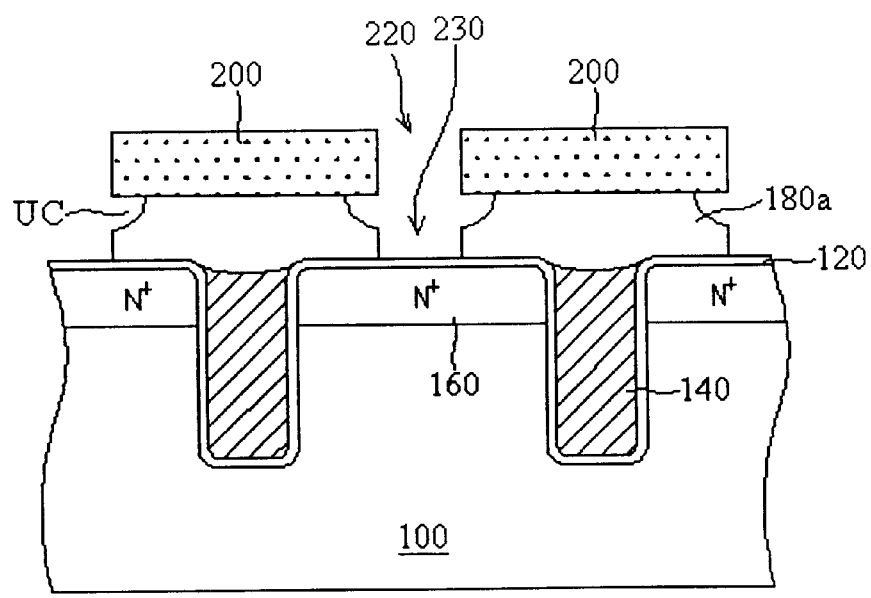

Referring to FIG. 2D, the insulating layer 180 is etched through the opening 220 by a wet etching using buffered oxide etchant (BOE) or a diluted hydrogen fluoride solution to form an undercut structure UC under the photoresist pattern 200. Then, a dry etching (e.g. reactive ion etching) is used to form a source contact window 230 having an enlarged portion and to leave an insulator structure 180a. That is, the source contact window 230 is bowl-shaped at the top as shown in FIG. 2D or tapered.

Figure 2E:
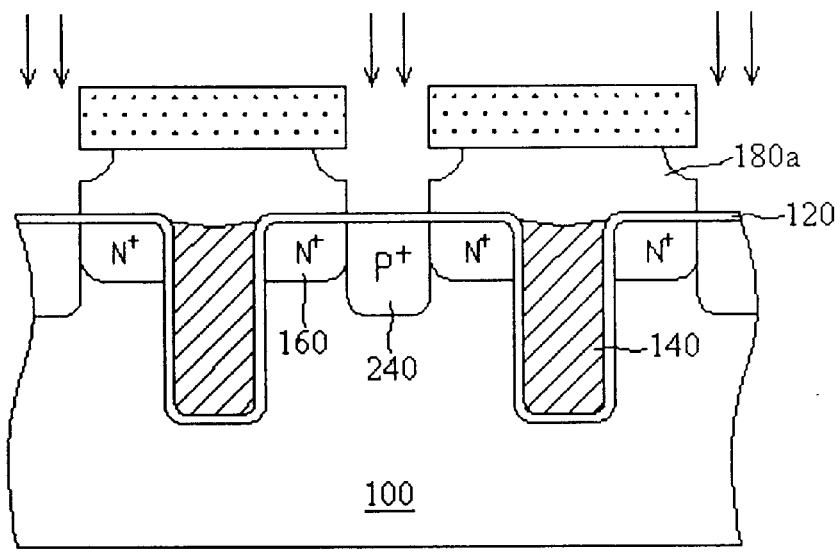
Figure 2F:
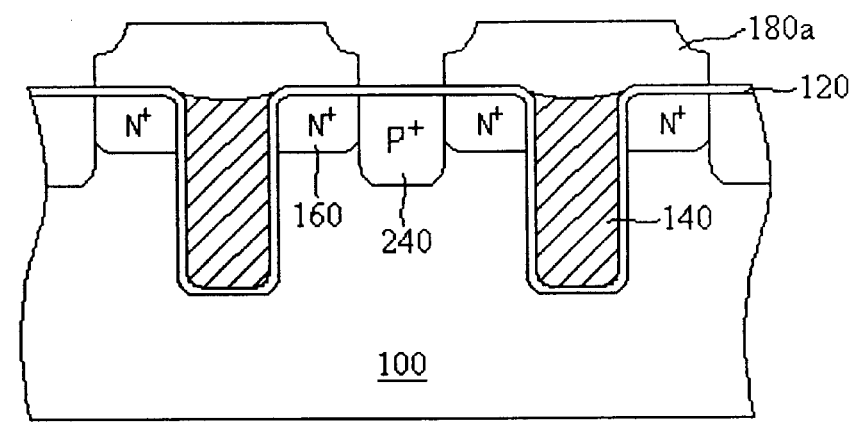

Next, referring to FIG. 2E, ion implantation is performed to dope P-type impurities or dopants such as boron or boron fluoride to form a P-type doping region 240 within the N-type doping region 160. An adequate P-type doping system (for example high energy and/or doping concentration) is used so that the junction depth of P-type doping region 240 is larger than that of the N-type doping region 160. Also, a portion of the P-type doping region 240 is created by reversing the conductive type of the N-type doping region 160. Next, as shown in FIG. 2F, the photoresist pattern 200 is stripped so as to expose the insulator structure 180a.

Figure 2G:
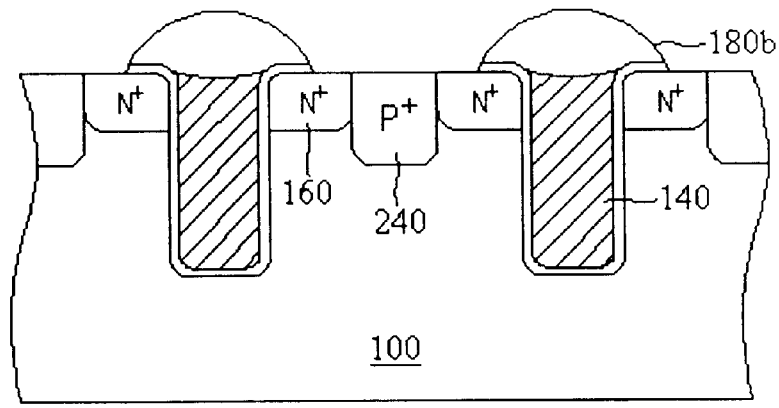
Figure 2G:
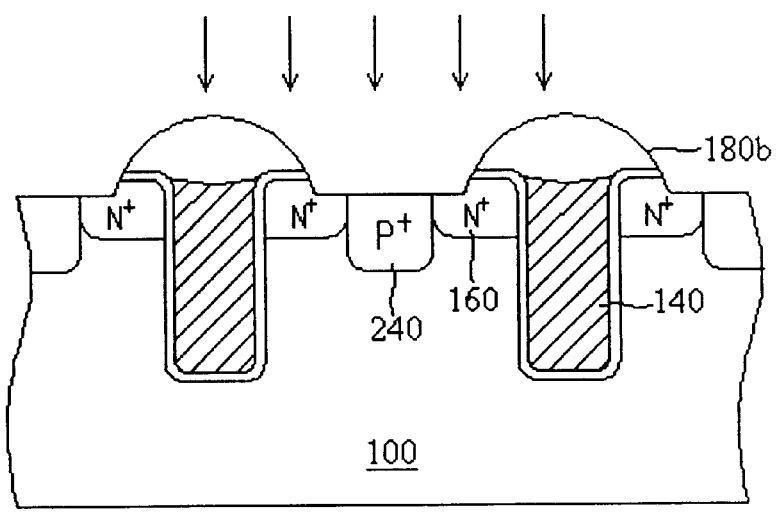

Referring to FIG. 2G, if necessary, the insulator structure 180a is isotropically etched by BOE to form an insulator structure 180b with a rounded surface. This can reduce the subsequent deposition complexity. That is, the conductive material such as a metal layer can be easily deposited on the insulator structure 180b. An aluminum layer (not shown) is then sputtered on the insulator structure 180b to contact the source contact window 230.

In another embodiment, the steps illustrated in FIGS. 2A to 2F are carried out to form the source contact window 230 with the enlarged portion that is bowl-shaped or tapered at the top in the insulator structure 180a.

Next, as shown in FIG. 2G', the insulator structure 180a is isotropically etched by BOE to form an insulator structure 180b with a rounded surface. At the same time, a portion of the P-type doping region 240 and N-type doping region 160 is etched from the upper surface of the semiconductor substrate 100, where the concentration of N-type dopants is larger than that of the maximum concentration of the P-type dopants. As a result, the contact area of N-dopant can be increased, as illustrated in FIG. 2G', so as to reduce the RC value.

Alternately, the etching step in FIG. 2G' from the upper surface of the semiconductor substrate 100 can be carried out in the step of etching through the opening 220 to form the source contact window 230 having the enlarged portion as described above and illustrated in FIG. 2D.

According to the embodiments of the invention, the method of fabricating a DMOS transistor can reduce processing complexity by eliminating at least one photolithography process.

Furthermore, the method of fabricating a DMOS transistor can reduce the thermal budget by using wet etching to replace thermal re-flowing. Also, the reliability of the DMOS transistor can be improved.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method of fabricating a DMOS transistor, the method comprising:

providing a semiconductor substrate having a gate oxide and a trenched gate;

implanting first conductive dopants into a surface of the semiconductor substrate adjacent to the trenched gate to form a first doping region;

depositing an insulating layer over the semiconductor substrate;

selectively etching the insulating layer to form a source contact window over a central portion of the first doping region and to leave an insulator structure above the trenched gate, the source contact window of the insulating layer having an enlarged, top portion which is larger in size than a bottom portion of the source contact window closer to the first doping region than the enlarged top portion; and implanting second conductive dopants through the source contact window to form a second doping region in the central portion of the first doping region, at least a portion of the second doping region being formed by changing a conductive type of the central portion of the first doping region to a conductive type of the second conductive dopants.

2. The method of claim 1 further comprising performing a wet etching after implanting the second conductive dopants to reshape the insulator structure to form a rounded surface above the trenched gate.

3. The method of claim 1 wherein the first conductive dopants are N-type dopants, and the second conductive dopants are P-type dopants.

4. The method of claim 1 wherein the first conductive dopants are P-type dopants, and the second conductive dopants are N-type dopants.

5. The method of claim 1 wherein a junction depth of the first doping region is shallower than a junction depth of the second doping region.

6. The method of claim 1, wherein selectively etching the insulating layer comprises:

forming a photoresist pattern having an opening on the insulating layer above the first doping region; and dry etching the insulating layer through the opening to form the source contact window having the enlarged top portion over the central portion of the first doping region and to leave the insulator structure above the trenched gate.

7. The method of claim 1 further comprising forming a conductive layer on the insulator structure, after implanting the second conductive dopants, to contact the source contact window.

8. The method of claim 7 wherein the conductive layer is made of aluminum or an aluminum alloy.

9. The method of claim 1 wherein the insulating layer comprises BPSG.

10. The method of claim 1 wherein the insulating layer comprises silicon oxide.

11. The method of claim 1 further comprising removing a portion of the first doping region and the second doping region from the surface of the semiconductor substrate, wherein the first doping region has a concentration of the first conductive dopants which is larger than a maximum concentration of the second conductive dopants in the second doping region.

12. The method of claim 1 wherein the first doping region is formed by implanting the first conductive dopants into the surface of the semiconductor substrate without using a mask.

13. A method of fabricating a DMOS transistor, the method comprising:

providing a semiconductor substrate having a gate oxide and a trenched gate;

implanting N-type dopants into a surface of the semiconductor substrate adjacent to the trenched gate to form an N-type doping region;

depositing an insulating layer over the semiconductor substrate;

forming a photoresist pattern having an opening above a central portion of the N-type doping region;

wet etching the insulating layer through the opening of the photoresist pattern to form an undercut structure in the insulating layer below the opening of the photoresist pattern;

dry etching the insulating layer through the opening of the photoresist pattern to form a source contact window over the central portion of the N-type doping region and to leave an insulator structure under the photoresist pattern and above the trenched gate, the source contact window of the insulating layer having an enlarged top portion formed by the undercut structure;

implanting P-type dopants through the source contact window to form a P-type doping region in the central portion of the N-type doping region, at least a portion of the P-type doping region being formed by reversing a conductive type of the central portion of the N-type doping region; and removing the photoresist pattern.

14. The method of claim 13 further comprising performing a wet etching after removing the photoresist pattern to reshape the insulator structure to form a rounded surface above the trenched gate.

15. The method of claim 14 further comprising forming a conductive layer on the insulator structure to contact the source contact window.

16. The method of claim 13 wherein the conductive layer is made of aluminum or an aluminum alloy.

17. The method of claim 13 wherein the insulating layer comprises BPSG.

18. The method of claim 13 wherein the insulating layer comprises silicon oxide.

19. The method of claim 13 wherein a junction depth of the N-type doping region is shallower than a junction depth of the P-type doping region.

20. The method of claim 13 wherein wet etching of the insulating layer is performed by buffered oxide etchant (BOE) or hydrogen fluoride (HF).

21. The method of claim 13 wherein dry etching of the insulating layer is performed by reactive ion etching (RIE).

22. The method of claim 13 wherein the N-type doping region is formed by implanting the N-type dopants into the surface of the semiconductor substrate without using a mask.

* * * * *